(12) United States Patent
Delacruz et al.

(10) Patent No.: US 10,748,824 B2
(45) Date of Patent: Aug. 18, 2020

(54) PROBE METHODOLOGY FOR ULTRAFINE PITCH INTERCONNECTS

(71) Applicant: Invensas Bonding Technologies, Inc., San Jose, CA (US)

(72) Inventors: Javier A. Delacruz, San Jose, CA (US); Paul M. Enquist, Durham, NC (US); Gaius Gillman Fountain, Jr., Youngsville, NC (US); Ilyas Mohammed, Santa Clara, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 16/701,606

(22) Filed: Dec. 3, 2019

(65) Prior Publication Data

US 2020/0105630 A1 Apr. 2, 2020

Related U.S. Application Data

(62) Division of application No. 15/837,941, filed on Dec. 11, 2017, now Pat. No. 10,529,634.

(Continued)

(51) Int. Cl.
*H01L 21/66* (2006.01)
*H01L 23/00* (2006.01)

(52) U.S. Cl.
CPC ............ *H01L 22/32* (2013.01); *H01L 24/80* (2013.01); *H01L 22/14* (2013.01); *H01L 22/20* (2013.01);

(Continued)

(58) Field of Classification Search
None
See application file for complete search history.

(56) References Cited

U.S. PATENT DOCUMENTS 5,597,737 A 1/1997 Greer et al.
5,753,536 A 5/1998 Sugiyama et al.
(Continued)

FOREIGN PATENT DOCUMENTS

JP 2013033786 A5 9/2014
JP 2018160519 A 10/2018
WO 2005043584 A2 5/2005

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Khaja Ahmad

(57) ABSTRACT

Representative implementations of devices and techniques provide a temporary access point (e.g., for testing, programming, etc.) for a targeted interconnect located among multiple finely spaced interconnects on a surface of a microelectronic component. One or more sacrificial layers are disposed on the surface of the microelectronic component, overlaying the multiple interconnects. An insulating layer is disposed between a conductive layer and the surface, and includes a conductive via through the insulating layer that electrically couples the conductive layer to the target interconnect. The sacrificial layers are configured to be removed after the target interconnect has been accessed, without damaging the surface of the microelectronic component.

10 Claims, 5 Drawing Sheets

Related U.S. Application Data

(60) Provisional application No. 62/504,792, filed on May 11, 2017.

(52) U.S. Cl.
CPC .... *H01L 24/03* (2013.01); *H01L 2224/03009* (2013.01); *H01L 2224/0392* (2013.01); *H01L 2224/05571* (2013.01); *H01L 2224/05647* (2013.01); *H01L 2224/80051* (2013.01); *H01L 2224/80052* (2013.01); *H01L 2224/80894* (2013.01)

(56) References Cited

U.S. PATENT DOCUMENTS

| | | |
|---|---|---|
| 5,771,555 A | 6/1998 | Eda et al. |
| 6,063,640 A * | 5/2000 | Mizukoshi ............ H01L 22/22 438/15 |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu et al. |
| 8,809,123 B2 | 8/2014 | Liu et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,337,235 B2 | 5/2016 | Chen et al. |
| 9,394,161 B2 | 7/2016 | Cheng et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,799,587 B2 | 10/2017 | Fujii et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,026,605 B2 | 7/2018 | Doub et al. |
| 10,075,657 B2 | 9/2018 | Fahim et al. |
| 10,269,756 B2 | 4/2019 | Uzoh |
| 10,276,619 B2 | 4/2019 | Kao et al. |
| 2004/0084414 A1 | 5/2004 | Sakai |
| 2006/0057945 A1 | 3/2006 | Hsu et al. |
| 2006/0076159 A1 | 4/2006 | Daubenspeck et al. |
| 2007/0111386 A1 | 5/2007 | Kim et al. |
| 2008/0083992 A1 * | 4/2008 | Lin ..................... H01L 24/05 257/774 |
| 2009/0149015 A1 | 6/2009 | Chang |
| 2010/0044859 A1 | 2/2010 | Yamaguchi et al. |
| 2012/0238044 A1 * | 9/2012 | Shibata ................ H01L 22/20 438/17 |
| 2014/0175655 A1 | 6/2014 | Chen et al. |
| 2015/0064498 A1 | 3/2015 | Tong |
| 2016/0343682 A1 | 11/2016 | Kawasaki |
| 2016/0370422 A1 | 12/2016 | Kim et al. |
| 2017/0053844 A1 | 2/2017 | Tsai et al. |
| 2017/0062291 A1 | 3/2017 | Arvin et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0115277 A1 | 4/2019 | Yu et al. |
| 2019/0131277 A1 | 5/2019 | Yang et al. |

OTHER PUBLICATIONS

Moriceau, H. et al., "Overview of Recent Direct Wafer Bonding Advances and Applications", Advances in Natural Sciences—Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

* cited by examiner

US 10,748,824 B2

PROBE METHODOLOGY FOR ULTRAFINE PITCH INTERCONNECTS

PRIORITY CLAIM AND CROSS-REFERENCE TO RELATED APPLICATION

This application claims the benefit U.S. Non-Provisional application Ser. No. 15/837,941, filed Dec. 11, 2017, and also claims priority to U.S. Provisional Application No. 62/504,792, filed May 11, 2017, which is hereby incorporated by reference in its entirety.

FIELD

The following description relates to integrated circuits ("ICs"). More particularly, the following description relates to testing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies on a larger base die, stacking multiple dies in a vertical arrangement, and various combinations of both. Dies may also be stacked on wafers or wafers may be stacked on other wafers prior to singulation. The dies or wafers may be bonded in a stacked arrangement using various bonding techniques, including direct bonding, non-adhesive techniques such as a ZiBond® technique or a hybrid bonding technique, also known as DBI®, both available from Invensas Bonding Technologies, an Xperi company (see for example, U.S. Pat. Nos. 6,864,585 and 7,485,968, which are incorporated herein in their entirety).

There can be a variety of challenges to implementing stacked die and wafer arrangements. For example, as IC chip technology matures, smaller packages are possible due to smaller and denser ICs. Finer pitch interconnects are a natural result of finer pitch design rules, and are also desirable to connect smaller chip packages and components to each other and to other carriers, PCBs, and the like. Fine pitch interconnects can be tightly arranged on a die surface (e.g., 1-10 um), however, making access to a particular interconnect by a test probe or a programming probe (e.g., 20-40 um) difficult. For instance, the size of the probe compared to the pitch and density of the fine pitch interconnects can cause multiple interconnects to be shorted while accessing a single pad. Further, it can be possible to damage a small pad while probing it for testing or programming.

This is particularly true in the case of true three dimensional packaging, where the signal pitch can be much finer than what can be practically probed. Interconnect size and pitch on the dies can be significantly reduced and interconnect density can be greatly increased with direct bonding techniques. Thus, the neighborhood of a test pin could be too crowded to fit a larger pad on the die surface. Additionally, with hybrid bonding a.k.a. DBI®, the topology induced by a probe may make the surface incapable of bonding. Surface topologies within nanometer range are generally required for this hybrid bond, and the scrub of a probe can cause surface topology disruptions, sometimes much greater than several nanometers.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Figure 1A:
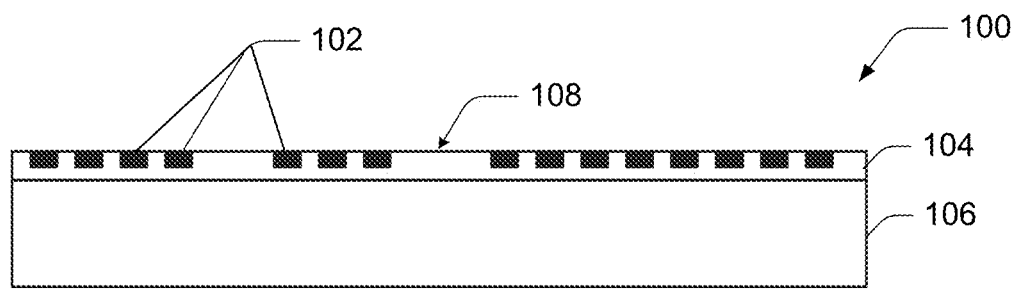
FIG. 1A shows an example profile view of a microelectronic component including a surface having a plurality of exposed conductive interconnects.

In various implementations, a first removable conductive layer is disposed over a die surface and overlays a portion of the die surface. The die surface includes a plurality of conductive interconnects, which may be very finely spaced (e.g., 10-20 um). The first layer is electrically coupled to an isolated target interconnect on the die surface, which is one of the plurality of conductive interconnects. A second removable insulating layer is disposed on the die surface between the first layer and the plurality of conductive interconnects. The second layer is configured to isolate the target interconnect from other interconnects of the plurality of conductive interconnects and to insulate the other interconnects of the plurality of conductive interconnects from the first layer. A removable conductive via is disposed through the second layer and couples the first layer to the target interconnect.

In some implementations, the conductive layer comprises a removable probe pad configured to provide access to the target interconnect by a probe device (e.g., test probe, programming probe, enable probe, etc.) having a probe tip that is larger than a spacing between the target interconnect and at least one of the other interconnects of the plurality of conductive interconnects, without shorting the target interconnect to any of the other interconnects of the plurality of conductive interconnects. For example, the insulating layer is arranged to prevent the conductive probe pad from unintentionally shorting interconnects to each other and to the target interconnect.

In an implementation, the first and second layers and the via are configured to be removed when desired, after the target interconnect has been externally accessed, without causing damage to the surface of the die. The die surface may be finely polished and prepared (using various techniques) for bonding (e.g., direct bonding without adhesive) prior to adding the sacrificial layers or after accessing the target interconnect and subsequent removal of the sacrificial layers.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic element." For simplicity, such components will also be referred to herein as a "die."

Implementations are explained in more detail below using a plurality of examples. Although various implementations and examples are discussed here and below, further implementations and examples may be possible by combining the features and elements of individual implementations and examples.

DETAILED DESCRIPTION

Overview

A profile view of an example microelectronic component ("die") 100 is illustrated at FIG. 1A. As illustrated, an example die 100 can include one or more conductive interconnects 102 surrounded by an insulating material 104 (oxide, for example), formed and supported on a substrate 106. The die can include multiple conductive and insulating layers (not shown) to determine the function of the die 100 (e.g., memory, processing, programmable logic, etc.). The interconnects 102 are electrically continuous with the various conductive layers, and provide an interface for the die 100.

A surface 108 of the die 100 includes a plurality of exposed conductive interconnects 102, for transportation of signals, data, supply, and the like, to and from the die 100. In many cases, the die 100 is arranged to interface with other microelectronic components, including with other "dies 100," or the like, through adhesive-free direct bonding, or other interface techniques. In these cases, the interconnects 102 are intended to electrically couple to other interconnects, pads, terminals, bonds, and so forth of the other dies.

As part of the manufacturing process, and relative to such bonding, it can be desirable to test the functionality of portions the die 100, and particularly one or more of the interconnects 102. However, due to the pitch of the interconnects 102, this can be problematic, as discussed above. While it may not be necessary to test all of the interconnects 102, it may be desirable to test specific targeted interconnects 110. These interconnects 110 can include IEEE 1500 or J-tag interfaces, and the like.

Figure 1B:
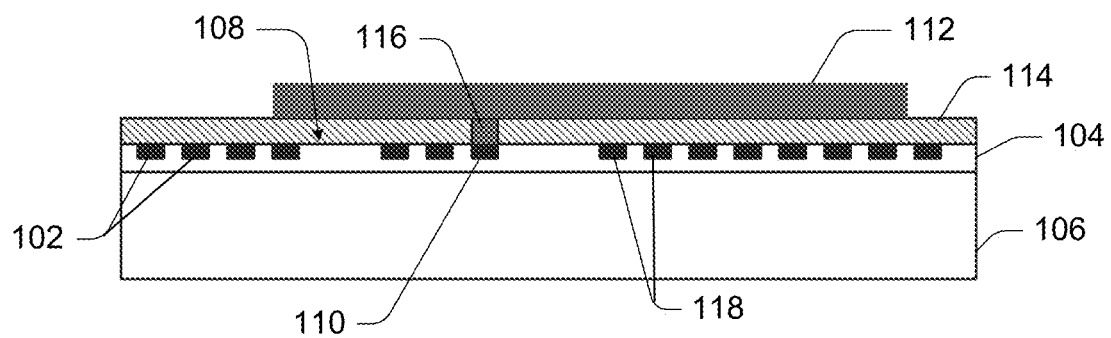
FIG. 1B shows an example profile view of the microelectronic component of FIG. 1A, including one or more sacrificial layers, according to an embodiment.

As shown at FIG. 1B, in various implementations, innovative devices and techniques can be used to access the small and/or finely-pitched interconnects 102 on a die 100 surface 108 for testing or programming the die 100. For example, a larger probe pad 112 that is accessible to a test probe 202 can be temporarily formed over the die surface 108 (on one or more new additional layers). An insulating layer 114 is formed between the probe pad 112 and the die surface 108, with a conductive via 116 allowing access through the insulating layer 114 to the target interconnect 110 under test or for programming. With the temporary probe pad 112 in place, the target interconnect 110 is accessible to manual or automatic probing, testing, programming, or the like. The insulating layer 114 provides protection against overlapped interconnects 118 shorting, and isolates the target interconnect 110 under test from the rest of the die 100 components (such as the interconnects 102 and 118, etc.).

The materials for the probe pad 112 and the insulating layer 114 may be comprised of materials that are relatively easy to remove without damaging the surface 108 of the die 100 or the interconnect pads 102 and 118, which may have been prepared for bonding. In an embodiment, the layers 112 and 114 comprise materials with a high selectivity to underlying layers (e.g., high selectivity to the copper interconnects 118, oxide layer 104, etc.) with one or a combination of wet etch, dry etch, and chemical mechanical polishing (CMP). In alternate embodiments, the layers 112 and/or 114 can comprise multiple layers of different materials (not shown).

The temporary probe pad 112 may be added to the die surface 108 using a variety of techniques. In one example, the die surface 108 is prepared by CMP for instance, and is polished to expose and isolate the metallic interconnect pins or pads 102 on the surface 108 of the die 100. The die surface 108 does not need to be perfect at this stage, since further polishing will likely be needed after removal of the temporary probe pad 112. The insulating layer 114 is deposited (and cured if needed) around the area of the target interconnect 110 to be probed. For instance, dielectrics such as some nitrides or oxides (or the like), including inorganic, organic, or polymeric materials may be used for the insulating layer 114.

The insulating layer 114 is formed large enough to be practical for probing, and to protect surrounding interconnects 102 and 118 from contact or shorting. In an embodiment, the target interconnect(s) 110 to be probed may be designed to be located on the surface 108 of the die 100 with enough spacing between them to simultaneously form probe pads for each, without overlapping (see FIG. 4, for example).

A contact via 116 is patterned and etched through the insulating layer 114 over the target interconnect 110 to be probed, exposing the target interconnect 110. Then a seed metal (titanium, for example) that can be etched and/or polished off the copper interconnects, and is compatible with subsequent CMP polishing for DBI bonding, is deposited onto the insulating layer 114 and within the contact via 116. A further metallic layer (aluminum, for example) is deposited onto the seed layer, and is etched (as well as the seed metal) as necessary to form the temporary probe pad 112. In some embodiments, the contact via 116 and the probe pad 112 are formed in a concurrent deposition process, and with some or all of the same material(s). In other cases, the contact via 116 and the probe pad 112 may be formed in separate steps or separate deposition processes. In many cases, the probe pad 112 overlays one or more of the other interconnects 118, as illustrated. The temporary probe pad 112 is then ready for use (for testing, programming, etc.).

Figure 2A:
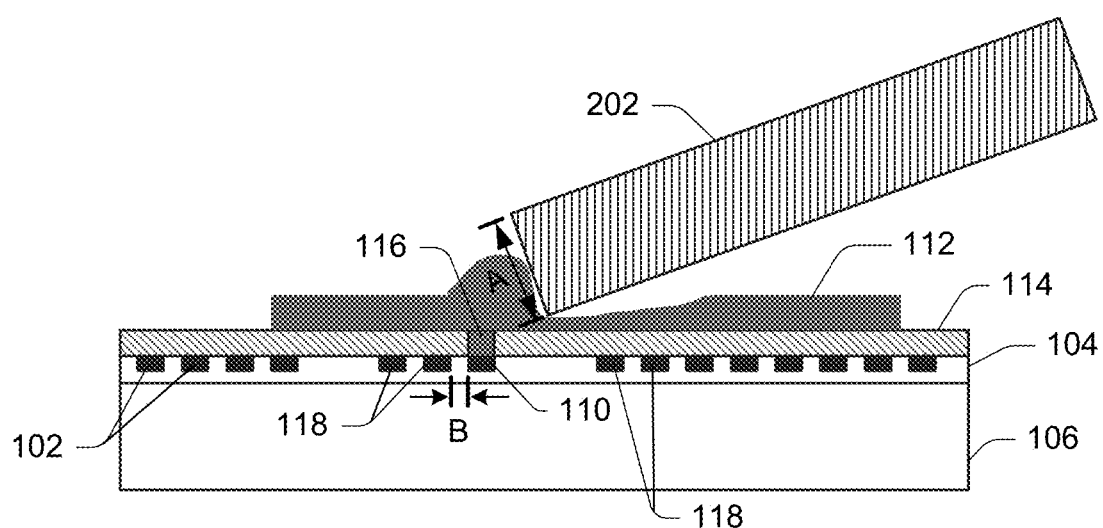
FIG. 2A shows an example profile view of the microelectronic component of FIG. 1B, including a test or programming probe accessing a target interconnect, according to an embodiment.
Figure 2B:
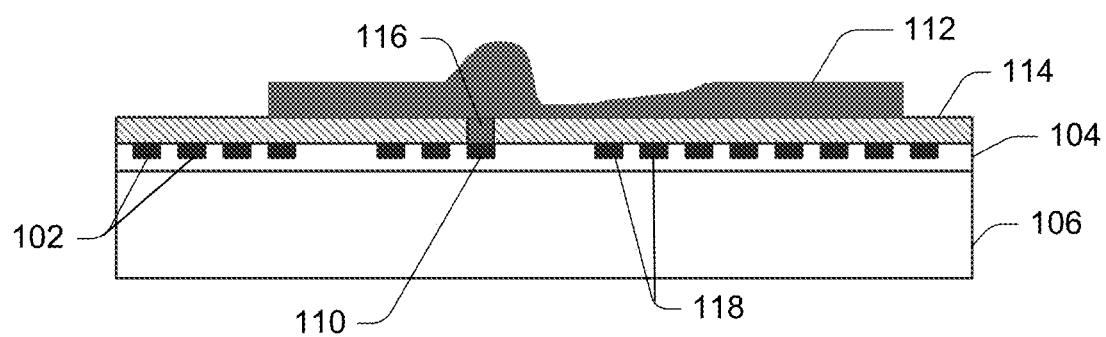
FIG. 2B shows an example profile view of the microelectronic component of FIG. 2A, including the sacrificial layers after accessing the target interconnect, according to an embodiment.

As illustrated at FIG. 2A, a probe 202 can then be used to access the target interconnect 110 that has a probe tip that is larger (dimension "A") than a spacing (dimension "B") between the target interconnect 110 and at least one of the other interconnects 102 or 118, without shorting the target interconnect 110 to any of the other interconnects 102 or 118. For instance, a probe 202 with a tip dimension of 40 microns can be used to access a target interconnect 110 when the pitch of the plurality of conductive interconnects 102, 110, and 118, is less than 20 microns. In alternate embodiments, the probe tip dimension and interconnect 102, 110, and 118 spacing and pitch dimensions can vary. For instance, in various examples, the pitch of the plurality of conductive interconnects 102, 110, and 118, can be less than 1 micron, 1 to 5 microns, 5 to 10 microns, 10 to 20 microns, and so forth, and a probe 202 with a tip dimension of around 40 microns can be used to access a target interconnect 110 without shorting the target interconnect 110 to any of the other interconnects 102 or 118. As shown at FIGS. 2A and 2B, the use of the probe 202 on the probe pad 112 can deform the probe pad 112.

In an embodiment, a removable conductive trace (not shown) may be disposed on the surface of the insulating layer 114, leading to the probe pad 112. For instance, the removable conductive trace can be patterned, etc. on the insulating layer 114 and coupled to the probe pad 112 to provide external access to the probe pad 112, in case it is not practical or possible to reach the probe pad 112 with the probe 202. This allows the probe pad 112 to be positioned so as to not be directly over contact via 116. It should also be noted that 116 and 114 are representative only and that this structure could be comprised of multiple successive insulating and conductive layers forming a removable wiring or redistribution structure. Contact via may also contact multiple interconnects 110, if desired.

In various embodiments, the temporary probe pad 112, the insulating layer 114, and the temporary via 116 (and the removable trace, if used) are sacrificial layers. For instance, the layers 112 and 114 and the via 116 are configured to be removed after the target interconnect 110 has been externally accessed. For example, they may be removed (via wet etch, combination of chemical and mechanical removal, or the like) after the test or programming routine. In some cases, one or both of the probe pad 112 and the insulating layer 114 comprise multiple layers. In those cases, all or some of the layers may be removed after probing.

Figure 3:
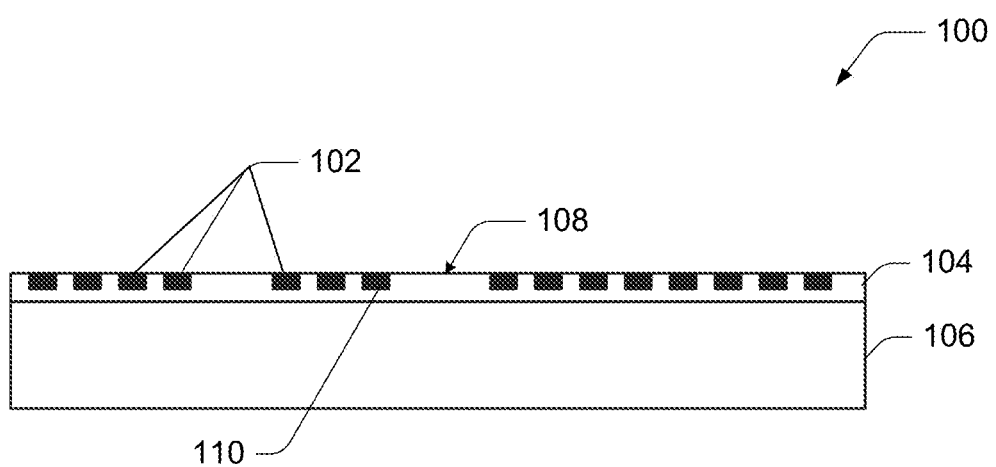
FIG. 3 shows an example profile view of the microelectronic component of FIG. 2B, after removal of the sacrificial layers, according to an embodiment.

For example, to remove the layers, the probe pad 112 metal (e.g., Al) is stripped off to stop selectively at the seed metal (e.g., Ti). The seed layer is touch-polished off the insulating layer 114 (the Ti layer may remain on the copper target pads 110 of the die surface 108). The insulating layer 114 (e.g., polymer dielectric) may be stripped off the die surface 108 using a wet or dry technique, a plasma technique, or the like. The die surface 108 may be polished (CMP) to remove the remainder of the seed metal from the interconnect pads 110, and the die surface 108 and interconnects 102 and 118 may be finish-polished afterwards, in some cases. As shown in FIG. 3, the die 100 is thus prepared for direct bonding, or the like.

In some implementations, where the temporary probe pad 112 is used to access an interconnect 110 for programming the die 100, removal of the probe pad 112 provides security against later access to the interconnect pad 110. For example, the interconnect pad 110 is no longer accessible for reading or writing to the die 100 without the temporary probe pad 112 in place. Accordingly, for security of the die 100, the probe pad 112 can be removed after accessing the target interconnect 110.

Figure 4:
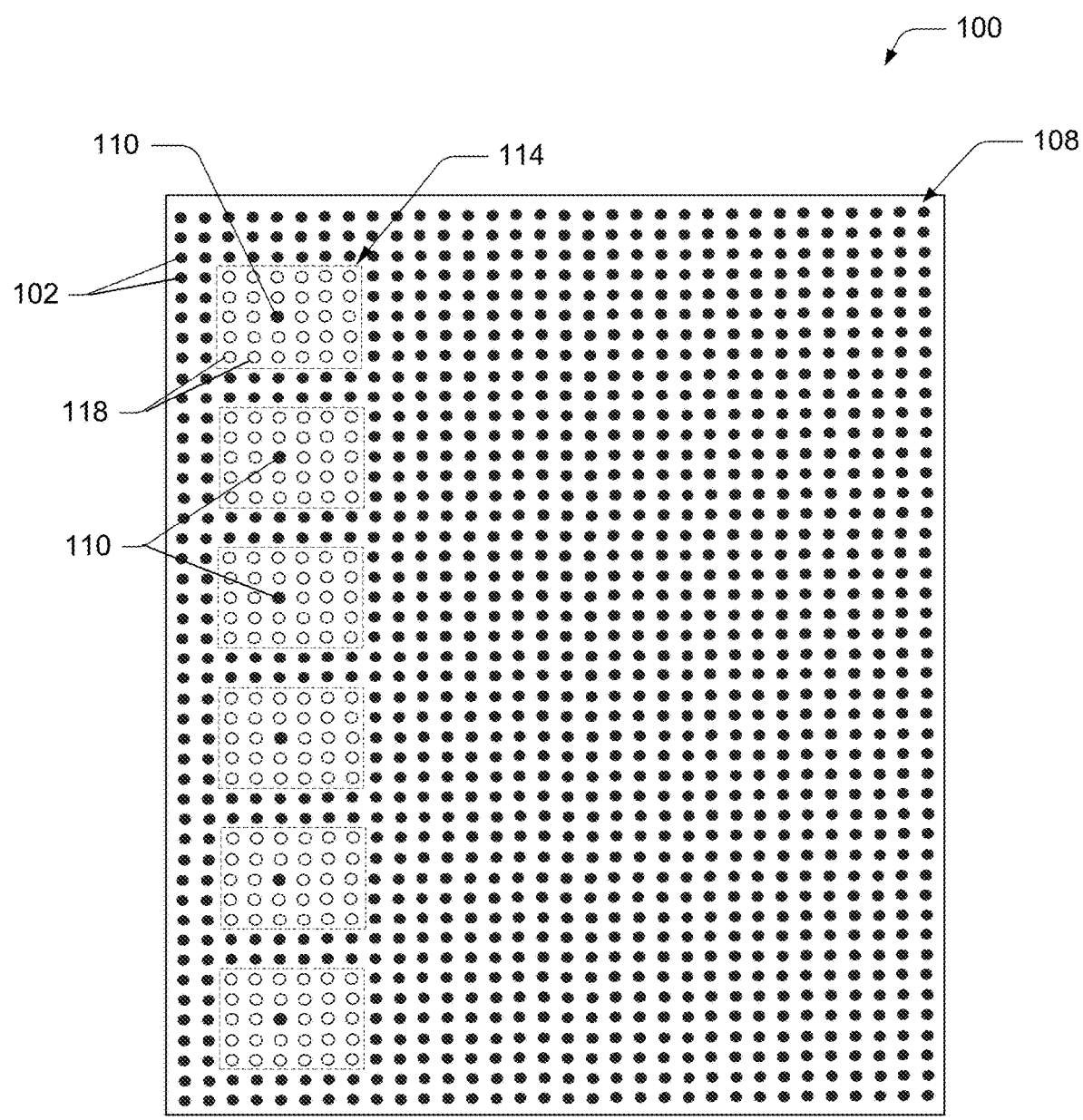
FIG. 4 shows an example top view of the microelectronic component of FIG. 2B, highlighting example sacrificial layer areas, according to an embodiment.

FIG. 4 shows an example top view of the die 100, highlighting example sacrificial layer areas, according to an embodiment. A target interconnect 110 is shown surrounded by other interconnects 102 and 118. The interconnects 118 represent interconnects that are overlapped by the probe pad 112, not shown. The insulating layer 114 has at least the same footprint as the probe pad 112, and can extend beyond the perimeter of the probe pad 112 if desired (for instance, to deposit a trace to the probe pad 112 from a remote location on the die 100, for fan out, etc.). Thus, the dotted line labeled 114 may represent the area covered by the pad 112 as well as the insulating layer 114, though the pad may be smaller. As shown in FIG. 4, in some cases it may be possible to locate multiple probe pads 112 on the surface 108 of the die 100 when desired to access multiple target interconnects 110. In those cases, the probe pads 112 may be located so that they do not overlap, if that is desired. In other cases, larger probe pads 112 (conductive layers) may be disposed on the die surface 108 that short two or more targeted interconnects 110 together, when that is desired for enabling, testing, or other functions.

The techniques, components, and devices described herein are not limited to the illustrations of FIGS. 1A-5, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

Unless otherwise specified, additional or alternative components to those specifically mentioned may be used to implement the techniques described herein. In various implementations, a die 100 may be a stand-alone unit, or it may be a portion of a system, component, structure, or the like.

Representative Process

Figure 5:
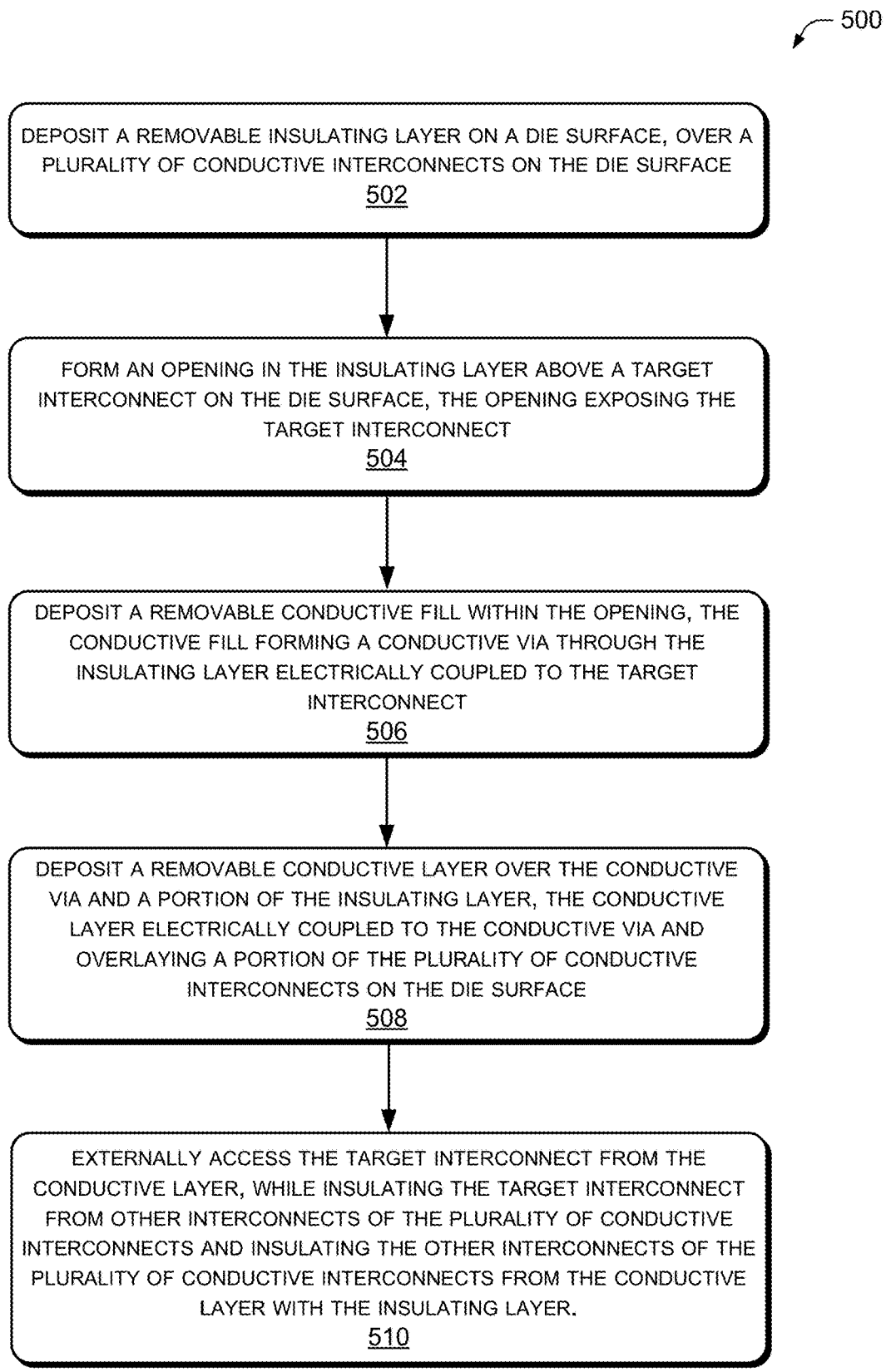
FIG. 5 is a flow diagram illustrating an example process for accessing a target interconnect located among finely spaced interconnects, according to an implementation.

FIG. 5 illustrates a representative process 500 for implementing techniques and/or devices for accessing a target interconnect (such as target interconnect 110, for example) located among finely spaced interconnects (such as interconnects 102 and 118, for example) on a surface of a microelectronic component (such as surface 108 of die 100, for example). The process 500 includes providing one or more sacrificial layers over the surface, which can be removed once the target interconnect has been accessed. The example process 500 is described with reference to FIGS. 1A-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 502, the process includes depositing a removable insulating layer (such as insulating layer 114, for example) on a die surface, over a plurality of conductive interconnects on the die surface.

At block 504, the process includes forming an opening in the insulating layer above a target interconnect on the die surface, the opening exposing the target interconnect. In an implementation, the insulating layer is patterned to form the opening. The temporary insulating layer material can be photoimagable, for example, or it can be a dielectric requiring a subsequent photoimagable layer applied to be able to resolve the opening as needed to access the target interconnect.

At block 506, the process includes depositing a removable conductive fill within the opening, the conductive fill forming a conductive via (such as via 116, for example) through the insulating layer electrically coupled to the target interconnect. In various embodiments, the process includes depositing a series of conductive layers, first by evaporation or sputtering or other means of barrier/seed layer deposition. Then an electroplating process or similar means of depositing a thicker layer can be used. In an implementation, the process includes depositing one or more additional removable layers between the conductive layer and the die surface, the conductive via electrically coupling the conductive layer to the target interconnect through the one or more additional layers.

At block 508, the process includes depositing a removable conductive layer (such as probe pad 112, for example) over the conductive via and a portion of the insulating layer. In an embodiment, metal may be sputtered patterned and then electrolessly plated to create the temporary pad metal, which is electrically continuous with the conductive via. In an implementation, the process includes depositing a seed layer which may also be a barrier metal, adding one or more additional photoimagable materials to resolve the removable conductive layer pad, electroplating up the pad metal, removing the photoresist, and removing the seed/barrier not covered by the plated metal. The conductive layer is electrically coupled to the conductive via and overlays a portion of the plurality of conductive interconnects on the die surface. In an implementation, the process steps at block 506 and 508 are performed concurrently during a process step. For example, the contact via and the removable conductive layer may be formed as part of the same process step(s) of metal deposition.

At block 510, the process includes externally accessing the target interconnect from the conductive layer, using a probe (such as such as probe 202, for example), or the like. The target interconnect is accessed while insulating the target interconnect from other interconnects of the plurality of conductive interconnects and insulating the other interconnects of the plurality of conductive interconnects from the conductive layer with the insulating layer.

In an implementation, the process includes externally accessing the target interconnect with a probe device having a probe tip that is larger than a spacing between the target interconnect and at least one of the other interconnects of the plurality of conductive interconnects, without shorting the target interconnect to any of the other interconnects of the plurality of conductive interconnects.

In various implementations, the process includes sending or receiving a signal through the target interconnect and/or enabling or programming the die through the target interconnect prior to removing the insulating layer, the conductive fill, and the conductive layer.

In another implementation, the process includes forming one or more additional openings in the insulating layer above one or more peripheral interconnects on the die surface, wherein the one or more additional openings expose the one or more peripheral interconnects; depositing the removable conductive fill within the one or more additional openings, wherein the conductive fill forms one or more additional conductive vias through the insulating layer electrically coupled to the one or more peripheral interconnects; and temporarily electrically coupling the target interconnect and the one or more peripheral interconnects through the conductive layer. In the implementation, the conductive layer networks the multiple interconnects temporarily for enabling, testing, or other functions.

In an implementation, the process includes removing the insulating layer, the conductive fill, and the conductive layer (and any additional removable layers) after the target interconnect has been externally accessed. In an embodiment, the process includes using a highly-selectable chemical and/or mechanical etching to remove each of the insulating layer, the conductive fill, and the conductive layer without damaging an underlying layer of each, respectively.

In another embodiment, the process includes providing security to the die by restricting access to the target interconnect by removing the insulating layer, the conductive fill, and the conductive layer after the target interconnect has been externally accessed.

In an implementation, the process includes comprising planarizing the die surface and bonding the die surface to a surface of another microelectronic component using a direct bonding technique without adhesive, or the like.

In alternate implementations, other techniques may be included in the process in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method, comprising:
    depositing a removable insulating layer on a die surface, over a plurality of conductive interconnects on the die surface;
    forming an opening in the insulating layer above a target interconnect on the die surface, the opening exposing the target interconnect;
    depositing a removable conductive fill within the opening, the conductive fill forming a conductive via through the insulating layer electrically coupled to the target interconnect;
    depositing a removable conductive layer over the conductive via and a portion of the insulating layer, the conductive layer electrically coupled to the conductive via and overlaying a portion of the plurality of conductive interconnects on the die surface; and
    externally accessing the target interconnect from the conductive layer, while insulating the target interconnect from other interconnects of the plurality of conductive interconnects and insulating the other interconnects of the plurality of conductive interconnects from the conductive layer with the insulating layer; and
    removing the insulating layer, the conductive fill, and the conductive layer after the target interconnect has been externally accessed.

2. The method of claim 1, further comprising externally accessing the target interconnect from the conductive layer with a probe device having a probe tip that is larger than a spacing between the target interconnect and at least one of the other interconnects of the plurality of conductive interconnects, without shorting the target interconnect to any of the other interconnects of the plurality of conductive interconnects.

3. The method of claim 1, further comprising:
    forming one or more additional openings in the insulating layer above one or more peripheral interconnects on the die surface, the one or more additional openings exposing the one or more peripheral interconnects;
    depositing the removable conductive fill within the one or more additional openings, the conductive fill forming one or more additional conductive vias through the insulating layer electrically coupled to the one or more peripheral interconnects; and
    temporarily electrically coupling the target interconnect and the one or more peripheral interconnects through the conductive layer.

4. The method of claim 1, further comprising depositing one or more additional removable layers between the conductive layer and the die surface, the conductive via electrically coupling the conductive layer to the target interconnect through the one or more additional layers.

5. The method of claim 4, further comprising removing the one or more additional removable layers after the target interconnect has been externally accessed.

6. The method of claim 1, further comprising sending or receiving a signal through the target interconnect prior to removing the insulating layer, the conductive fill, and the conductive layer.

7. The method of claim 1, further comprising enabling or programming the die through the target interconnect prior to removing the insulating layer, the conductive fill, and the conductive layer.

8. The method of claim 1, further comprising using a highly-selectable chemical and/or mechanical etching to remove each of the insulating layer, the conductive fill, and the conductive layer without damaging an underlying layer of each, respectively.

9. The method of claim 8, further comprising planarizing the die surface and bonding the die surface to a surface of another microelectronic component using a direct bonding technique without adhesive.

10. The method of claim 1, further comprising providing security to the die by restricting access to the target interconnect by removing the insulating layer, the conductive fill, and the conductive layer after the target interconnect has been externally accessed.

* * * * *